US008536998B1

(12) United States Patent
Siu et al.

(10) Patent No.: US 8,536,998 B1
(45) Date of Patent: Sep. 17, 2013

(54) INTEGRATED ADAPTIVE WIRELESS MESH SENSOR PLATFORM AND ENERGY VISUALIZATION AND MANAGEMENT SYSTEM

(75) Inventors: David Siu, Aiea, HI (US); Ken C. K. Cheung, Kailua, HI (US); Joseph M. Cardenas, Honolulu, HI (US); Luke B. Joseph, Honolulu, HI (US); Ryan Y. Miyamoto, Honolulu, HI (US); Donald Harbin, Honolulu, HI (US)

(73) Assignee: Oceanit Laboratories, Inc., Honolulu, HI (US)

( * ) Notice: Subject to any disclaimer, the term of this patent is extended or adjusted under 35 U.S.C. 154(b) by 0 days.

(21) Appl. No.: 13/487,675

(22) Filed: Jun. 4, 2012

Related U.S. Application Data

(63) Continuation of application No. 12/291,407, filed on Nov. 10, 2008, now Pat. No. 8,193,929.

(60) Provisional application No. 61/002,498, filed on Nov. 9, 2007, provisional application No. 61/004,417, filed on Nov. 27, 2007.

(51) Int. Cl.
*G08B 1/08* (2006.01)
*H04M 11/04* (2006.01)
*H04Q 1/30* (2006.01)

(52) U.S. Cl.
USPC .................. 340/538; 340/870.01; 340/870.02

(58) Field of Classification Search
USPC ......... 340/538, 573.1, 539.1, 870.01, 870.02, 340/870.03
See application file for complete search history.

(56) References Cited

U.S. PATENT DOCUMENTS

| 5,491,473 | A | * | 2/1996 | Gilbert | 340/870.01 |
|---|---|---|---|---|---|
| 6,631,309 | B2 | | 10/2003 | Boies et al. | |
| 7,225,037 | B2 | * | 5/2007 | Shani | 700/18 |
| 7,274,305 | B1 | * | 9/2007 | Luttrell | 340/870.02 |
| 7,283,048 | B2 | * | 10/2007 | Stilp | 340/539.1 |
| 7,304,587 | B2 | * | 12/2007 | Boaz | 340/870.02 |
| 7,319,853 | B2 | * | 1/2008 | Luebke et al. | 455/344 |
| 7,324,824 | B2 | * | 1/2008 | Smith et al. | 455/456.1 |
| 7,343,226 | B2 | * | 3/2008 | Ehlers et al. | 700/276 |
| 7,394,385 | B2 | * | 7/2008 | Franco et al. | 340/573.1 |
| 7,733,224 | B2 | * | 6/2010 | Tran | 340/540 |

* cited by examiner

*Primary Examiner* — John A Tweel, Jr.
(74) *Attorney, Agent, or Firm* — James Creighton Wray

(57) ABSTRACT

A mesh-networked sensor platform has a mesh network of nodes that connect with existing electrical infrastructure or are powered through other means such as batteries or energy scavenging. The mesh network forms a self-healing and self-configuring network robust against individual node failures. Wireless mesh networking integrated circuits (ICs), energy monitoring ICs and solid state relays are used to create a low-cost, easy-to-install energy visualization and management system. The system can intelligently control energy usage at the sockets to stop energy from being wasted. Software for a central base station uses energy usage data from each node to create an energy usage profile to automatically detect anomalies in energy usage and take steps to correct them. Other sensors can be easily added for a multitude of applications. Power usage and control of each appliance can be viewed via an interne connected PC or smart phone via a social networking website.

7 Claims, 9 Drawing Sheets

Wireless Mesh Network

Wireless Mesh Network Waveform

INTEGRATED ADAPTIVE WIRELESS MESH SENSOR PLATFORM AND ENERGY VISUALIZATION AND MANAGEMENT SYSTEM

This application is a continuation of application Ser. No. 12/291,407 filed Nov. 10, 2008, now U.S. Pat. No. 8,193,929 which claims the benefit of U.S. Provisional Application Nos. 61/002,498 and 61/004,417, filed Nov. 9, 2007 and Nov. 27, 2007, respectively, which are hereby incorporated by reference in their entirety as if fully set forth herein.

TECHNICAL FIELD OF THE INVENTION

This invention relates to wireless sensor networks, measurement of electricity use, energy use management, and visualization of energy use.

BACKGROUND OF THE INVENTION

Wireless sensor networks have been around for 10 years or more but have not been widely adopted. A wireless sensor network is a spatially distributed network of autonomous sensing devices that cooperatively monitor physical or environmental conditions at different locations. Each node in the network has a wireless communications device in addition to its one or more sensors and energy source. Wireless sensor networks have many potential applications, including battlefield surveillance, environment and habitat monitoring, healthcare applications, home automation, security, and traffic control.

In currently available sensor networks, each node can cost $100 or more, limiting their large-scale deployment. In addition, typical nodes are battery powered which requires monitoring and periodic replacement of the battery. Needs exist for improved wireless sensor networks.

Buildings and homes waste billions of dollars of energy every year. Global climate change is considered by many to be the single greatest threat to the environment today. Many electronic devices, often referred to as Electronic Vampires, waste power by using electricity even when they are off. Electronic Vampires account for up to 10% of all energy usage and cost consumers and businesses up to 3.5 billion dollars a year. Electronic Vampires together with lights and computers that are left on and old inefficient appliances account for a significant amount of wasted energy. By reducing the amount of wasted energy in businesses by even 1%, we could save 140,000 barrels of oil or 40,000 tons of coal, preventing 27 million tons of $CO_2$ from being released into the atmosphere every year.

The average user's only method of visualizing energy usage is to see a monthly power bill. The vast majority of buildings are not wired for energy monitoring and control. Even the intelligent buildings that use Lonworks or KNX systems do not allow control and monitoring of each socket in the building. Similarly, aftermarket devices can be purchased that allow monitoring of a single socket at that socket, but an ability to monitor numerous points from a single database to manage overall power consumption is not available. Such universal monitoring is precluded by the costs of instrumentation.

Needs exist for improved systems for energy usage measurement, visualization, and management.

SUMMARY OF THE INVENTION

With the advent of low-cost, wireless-mesh networking technology it is possible to design and build a permanent integrated low-cost sensor network for new and existing buildings without adding or changing existing wiring. Adaptive wireless mesh networks may be integrated into existing electrical infrastructure. By doing so, numerous physical phenomena can be monitored and recorded for a limitless number of applications including but not limited to human presence/state detection, security, environmental monitoring, and energy management.

A system of wireless mesh networking systems in miniature electronic packages (e.g., integrated circuits or ICs) create a low-cost, easy-to-install, easy-to-use, expandable sensor platform that can be installed and integrated into any electrical system (e.g., electrical sockets, light fixtures, cigarette lighter, etc.). By powering a sensor network from electrical sockets and connections, the need for batteries and the required ultra-low-power electronics is eliminated.

Each socket network node communicates wirelessly to other nodes and one or more central base stations using an adaptive, or "self-healing", mesh network. The central base station compiles and stores the sensor data for real-time or historical analyses. The platform can have the same form factor as an electrical socket, making it easy to install. The potential for such a monitoring network is significant. Once the network is established, sensors can be easily added for a multitude of applications. For example:

Attaching a particle, temperature and humidity sensor to each node will enable environmental air quality monitoring and Heating, Ventilation, and Air Conditioning (HVAC) control.

Adding chemical sensors will allow monitoring for chemical spills or biological hazards.

Connecting smoke detectors and leak sensors will enable early notification of dangerous or damaging conditions.

Attaching cameras would allow surveillance of critical infrastructure for security or monitoring.

Adding active or passive radar sensors, or motion detectors, will enable detecting room occupancy so that the lighting and air-conditioning is adjusted appropriately and also vital signs monitoring (heart rate and respiration for example) for healthcare. These sensors also allow human presence, state and location monitoring for military, commercial and retail applications. For example, the traffic flow of a facility (e.g. a store or dwelling) can be monitored and studied to optimize the use and effectiveness of space. Radar may be monostatic or multistatic.

Connecting a current meter and relay enables the monitoring and control of the attached electrical device. In times of energy crisis, non-critical devices could be turned off to prevent rolling black outs.

The wireless communications system itself can be exploited for sensing applications. For example, the wireless networking waveform (including but not limited to Zigbee) can be a pseudo-active radar signal that can measure the presence, physiological state, and location of live targets (human and animal) for a multitude of applications. Through signal processing analyses of the radar returns, human targets can be distinguished from other humans, animals, and inanimate objects. If necessary, additional active radar sensors can be incorporated into the platform.

The position of the network nodes and measured targets can be determined from the radar returns using several methods including but not limited to received signal strength (RSS), time difference of arrival (TDOA), direction of arrival (DOA), and pulse-/frequency-modulated ranging. The localization capability of the system allows targets to be tracked spatially and temporally, potentially uniquely identified through their motion and vital-sign signature.

One implementation of a wireless mesh network sensor platform provides a low-cost, easy-to-install, networked energy visualization and power management system for buildings which helps users to significantly reduce the amount of energy that is wasted. A methodology that allows immediate and real time visualization and management of energy usage encourages more responsible use of energy.

These and further and other objects and features of the invention are apparent in the disclosure, which includes the above and ongoing written specification, with the claims and the drawings.

DETAILED DESCRIPTION OF THE DRAWINGS

System Composed of Easy-to-install Nodes and a Central Base Station

A wireless mesh sensor platform can be built by integrating COTS components and contains a number of nodes, with the intent being that each node will be able to host an array of sensors. The nodes form a wireless self-assembling and self-healing mesh network reporting back to one or more base stations. The nodes can be installed between appliances and their electrical connections (e.g., wall sockets), continuously monitoring the sensors and reporting back to a base station using wireless mesh networking ICs. The base station will receive, aggregate, and store all of the sensor data from the nodes into a database and generate real-time and historical information of each node and all nodes combined, or any combination thereof The base station can act as a local information server, or be connected to a remote management site, via the interne or otherwise.

Nodes Provide Low-Cost, Easy-To-Install Sensor Platform

Figure 1:
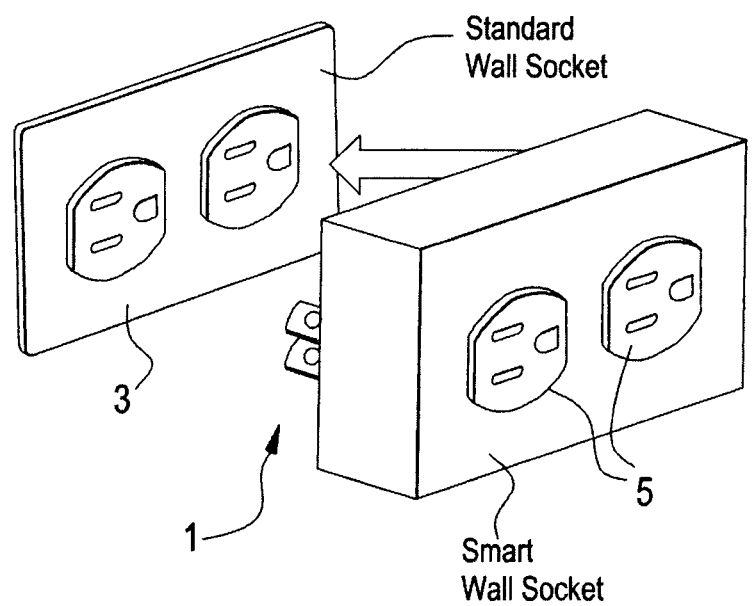
FIG. 1 is an illustration of a wireless network sensor platform node incorporated into a wall electrical socket.

The platform may contain nodes that are installed between appliances and the power infrastructure (e.g., the wall socket they are plugged into) as shown in a representative diagram in FIG. 1. In this example, no re-wiring or electrical work will be required for this system because the nodes can be plugged into existing wall sockets and appliances can be plugged into the corresponding socket on the node. Alternatively, the nodes can be configured to attach to a light bulb socket or any other available electrical connection (e.g., a vehicle cigarette lighter). The nodes contain off-the-shelf components which allow them to be designed and manufactured easily and cheaply. Each node has a microcontroller integrated with a wireless mesh networking transceiver, including but not limited to Zigbee.

Total parts cost of the node will scale directly with the number of units manufactured but the projected cost of each node will be as low as a few dollars for very large quantities. Versions of the nodes for power strips or other form factors can be developed, as well as permanent nodes built into the electrical infrastructure. In addition, remote battery-operated or energy-scavenging nodes can be incorporated as part of the system. For example, a wireless node may be body-worn to monitor an individual for medical or other applications.

Using this low-cost, wireless-mesh networking technology, one embodiment of the present invention makes it feasible to retrofit, monitor and control every electronic appliance in a building without changing existing wiring, resulting in significantly enhanced power management and energy reduction.

A methodology that allows immediate and real time visualization of energy usage encourages more responsible use of energy. A low-cost, easy-to-install, networked energy visualization and power management system for buildings will help users to significantly reduce the amount of energy that is wasted.

Low-cost wireless mesh networking electronics, including integrated circuits, or "ICs", energy monitoring electronics, and solid state relays are used to create a low-cost, easy-to-install energy visualization and management system. By monitoring each electronic appliance and wirelessly reporting the energy usage back to a central base station, energy usage profiles can be created, the first step in reducing wasted energy. Once an energy usage profile is available, the system can intelligently control energy usage at the sockets to stop energy from being wasted.

Software for the base station uses historical energy usage data to create an energy usage profile to automatically detect anomalies in energy usage and take steps to correct them. For example, by monitoring current energy usage and comparing it to historical data, the system can recognize if a light is left on accidentally when it is usually turned off. For non-critical appliances such as a light, the system can just turn it off. Another example is a dusty heat exchange coil of a refrigerator causing its compressor to go on more frequently. In this case, an email could be sent to the facilities manager with a work request to clean the coils.

Another example is home automation whereby a user could remotely control, turn on and turn off appliances from an internet-enabled smartphone or other mobile device. In yet another example, it could function as a home monitoring system whereby a user would receive an email alert indicating power being turned on an appliance when no one is in the home or office. All of these instances of monitoring may be visually displayed on a PC web page or internet-enabled smartphone so that time and location can be pinpointed.

Such a networked system will potentially have far-reaching benefits beyond energy conservation. This power management system is a platform from which an entire building's electronic devices and appliances can be intelligently linked, monitored, and controlled. As the system turns devices on and off to minimize energy waste, it can also be programmed to suit usage profiles. For example, in a residential application where the owner returns home from work, the system can turn on lights, stereo, and PC. When the owner goes on vacation, the system can be programmed to turn on lights and other devices in a pattern that mimics actual historical use, to deter would-be robbers. In another example, seamless integration with a building access control system could turn on lights, PC, and printer when a worker enters an office and then shuts off those appliances when the worker leaves.

Figure 10:
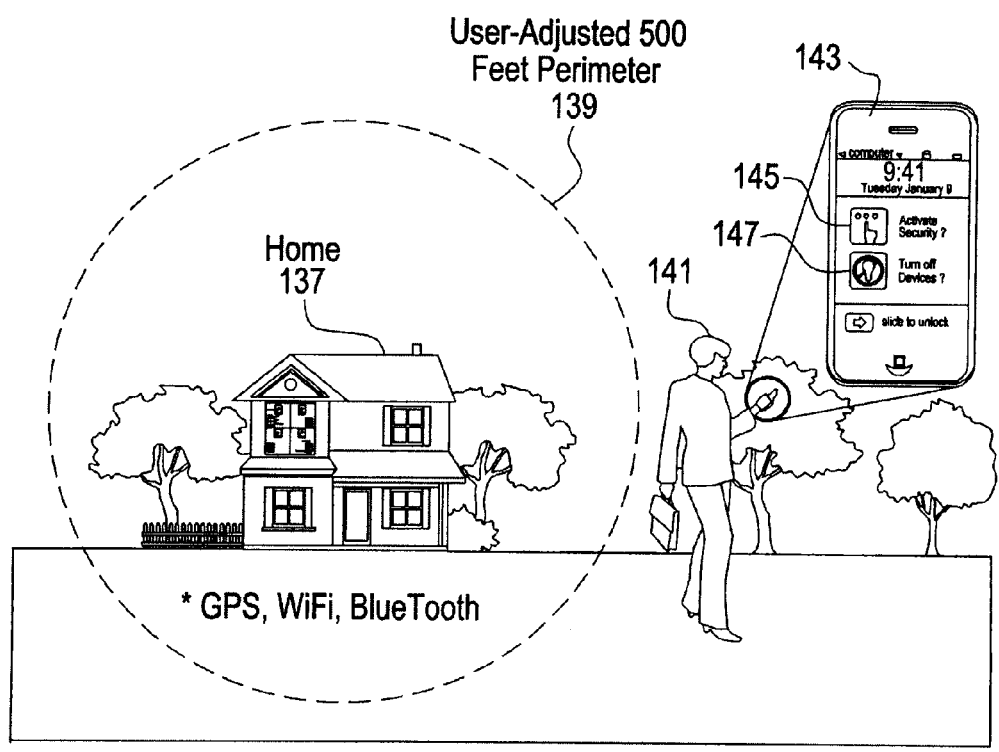
FIG. 10 illustrates an example mobile device location based mobile application interface.

With a mobile device (such as the Apple iPhone) that uses signals of opportunity to obtain location information (such as Global Positioning System (GPS), WiFi or Bluetooth), the monitoring network can be configured for automated activation/deactivation of devices (such as lights, appliances, and security systems) when the user leaves or re-enters a pre-defined area. FIG. 10 is a diagram of location-based mobile activation/deactivation iPhone user interface. It shows a residential software application where the owner 141 can set up a user-adjustable perimeter 139, say 500 feet, around his home 137. When the system detects the owner leaving the perimeter (using the GPS location service on the iPhone 143 for example), selected electronic devices can be powered down 147 and the security sensors activated 145. Upon re-entering the 500 feet perimeter, the owner could program the power up of selected electronic devices and deactivate the home security sensors automatically.

Easy-to-install Nodes and a Central Base Station

An energy visualization and measurement system can be built using COTS components and contains nodes. Each node may monitor two or more electrical appliances. Variants for other electrical connections, including light-bulb sockets, 240 VAC sockets, power strips and cigarette lighters, are also possible. The nodes form a wireless self assembling mesh network reporting back to a single base station. The nodes may be installed between appliances and their wall sockets, continuously monitoring the energy usage of their attached appliance using COTS energy metering ICs and reporting the energy usage back to a base station using COTS wireless mesh networking ICs. Each also contains wirelessly operated relays that enable intelligent control of the attached appliance. The base station may receive, aggregate, and store all of the energy data from the nodes into a database, generate real-time and historical energy usage graphs of each node and all nodes combined, and allow the control of each node via a web interface.

Low-cost, Low-power Energy Monitoring & Control of Attached Appliance

FIG. 1 shows a smart wall socket wireless network node 1. The node plugs into existing electrical infrastructure, for example, through a wall socket 3. No re-wiring or electrical work is required for the system because the nodes can be plugged into existing wall sockets and appliances can be plugged into the corresponding socket on the node. The nodes contain off-the-shelf components which allow them to be designed and manufactured easily and cheaply. The node 1 contains the wireless communications system as well as a platform for additional sensors. The node 1 is controlled via wireless communications with a base station that may be connected to a computer. The node 1 controls the operation of the sensor as well as the electrical connection to devices and appliances that are plugged into the node's socket 5.

Figure 5:
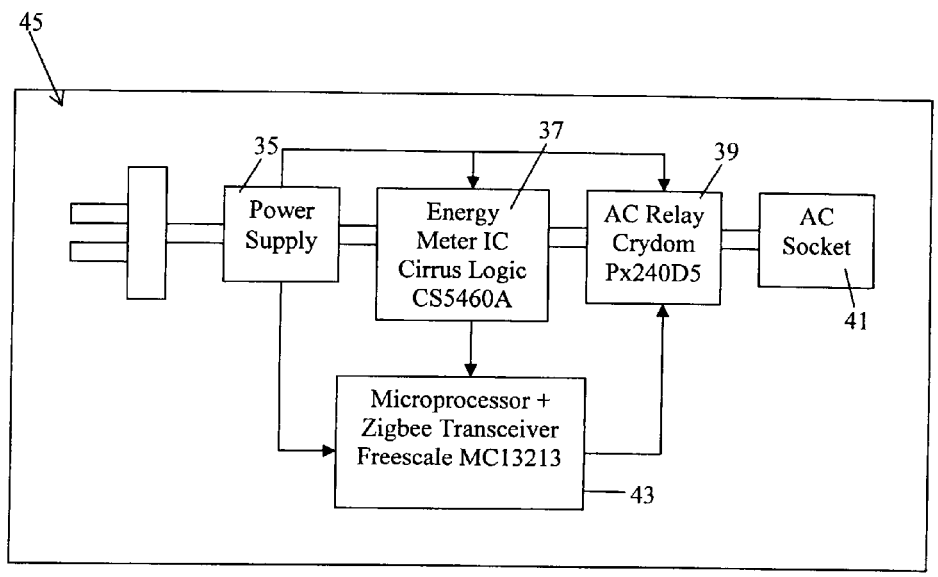
FIG. 5 is a block diagram of a smart wall socket node.

FIG. 5 is a block diagram of the smart wall socket node. Each node has a microcontroller integrated with a wireless mesh networking transceiver 43, two relays 39, and energy metering ICs 37. Appliances are plugged into an AC socket 41 and energy is routed from the power supply 35.

Total parts cost of the node will scale directly with the number of units manufactured but the projected cost of each node is very low for very large quantities. Other types of nodes can be used with power strips and lamps.

Power usage of each node is critical since a goal is to eliminate wasted energy. If each node used 10 W of energy, the system would waste more energy than it would save. The projected energy usage estimate of each node is 30 mW or 0.263 kWh (24hours per day×365 days per year×3.0×10$^{-5}$ Watts per node) per year. With the average price of electricity approximately $0.15 per kWh, it would cost $0.036 per year to monitor a single appliance.

Figure 2:
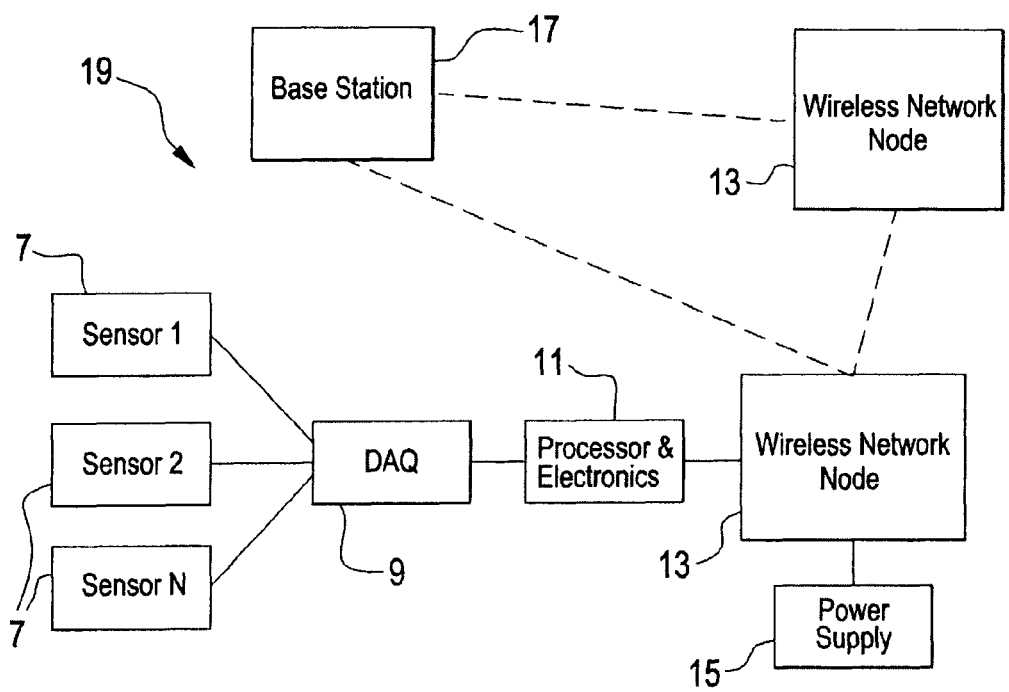
FIG. 2 is a block diagram of the wireless sensor platform system.

FIG. 2 shows a block diagram of a wireless mesh sensor network system 19. Sensors (1, 2, . . . N) 7 are connected to a node 13, via a data acquisition component 9 and electronic control circuitry 11. The node provides power via a power supply 15, which may be the electrical infrastructure or possibly a battery or energy harvesting source. The node communicates wirelessly to other nodes 13 and to one or more base stations 17. The network is self-healing, meaning that if nodes 13 become disconnected from the network, new communications paths to the base station 17 are found via the remaining network nodes 13.

The base station 17 controls the operation of the network and can be managed in a variety of ways, including: direct control via computer input; pre-programmed usage protocols; remote, real-time, user control (e.g., via internet connection); advanced adaptive algorithms such as neural networks, artificial intelligence, and genetic algorithms that can "learn" usage patterns and adapt to changes.

Figure 3:
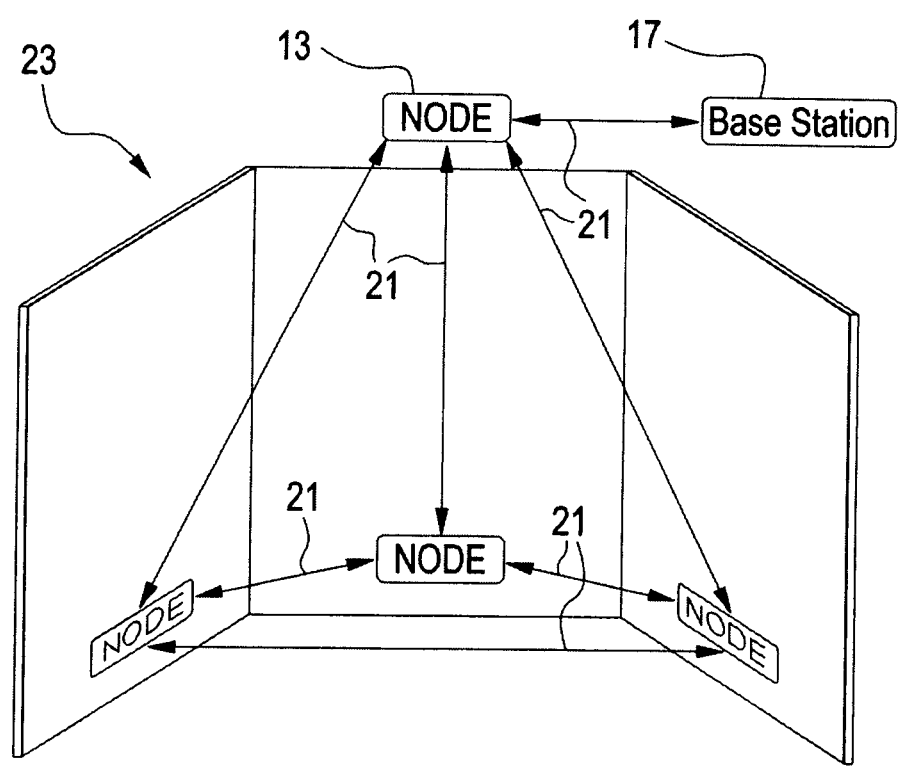
FIG. 3 is a diagram of a basic wireless mesh network.

FIG. 3 shows the mesh network 23 and possible paths of communications 21. The multiplicity of paths makes the mesh network robust to node failures. An example of a mesh network that is commercially available is Zigbee.

Wireless mesh networking is a key technology that enables a low-cost, easy-to-install system A key technology that enables the EVMS is the use of wireless mesh networking ICs. A mesh network such as Zigbee is important because it enables scalability and reliability. A mesh network is a generic name for a class of networked embedded systems that share several characteristics including:

Multihop Routing which is capable of sending messages peer-to-peer to a base station, thereby enabling scalable range extension;

Self-Configuring to enable network formation without human intervention;

Self-Healing to add and remove network nodes automatically without having to reset the network; and Dynamic Routing to provide adaptive determination of routing based on dynamic network conditions (e.g., link quality, hop-count, gradient, or other metric).

Mesh networks offer advantages over other networking technologies such as Homeplug, LonWorks, and Wifi because they have:

The lowest installation costs because no wiring is needed;

The lowest power usage since the specification was designed for low power and low data rate communications for battery powered devices;

Lowest cost due to wide industry acceptance and adoption;

Built using non-proprietary standardized hardware and software; and

Allows built in encryption for secure communications.

The following table compares the advantages and disadvantages of various networking technologies.

| Technology | IC cost | Installation Cost | Power Usage | Bandwidth |
|---|---|---|---|---|
| Zigbee | Low | Low | Low | Low |
| Wifi | Medium | Low | High | High |
| Homeplug | N/A | Low | N/A | High |
| LonWorks | High | High | Med | Med |

Mesh networks are capable of establishing continuous communication around broken or blocked paths by relaying messages from node to node until the destination is reached. FIG. 3 shows a depiction of a typical mesh network.

Very low power is needed for this type of network because each node 13 does not have to communicate directly with the central base station 17. As long as a node 13 can "see" another node 13, messages can be sent anywhere in the network. Thus, the network can be expanded to blanket a large area by simply adding nodes close to each other. For a Zigbee network, the nodes can be about 50 m apart. A mesh network can contain more than 65,000 nodes, large enough to monitor the energy usage of every appliance in a large building.

A quick calculation shows that it is feasible to send energy data once every 5 minutes with 65,000 nodes, transmitting a 23 byte payload with 15 bytes of packet overhead (including encryption):

65,000 nodes*(23 payload bytes+15 overhead bytes)*8 bits/byte/300 seconds=65.9 kpbs This worst case calculation, which assumes all traffic passes through each node, indicates that even in this scenario, only 44% of the network capacity is used for existing wireless mesh transceivers.

The Base Station Aggregates, Stores, and Displays Energy Data From the Nodes

Figure 6:
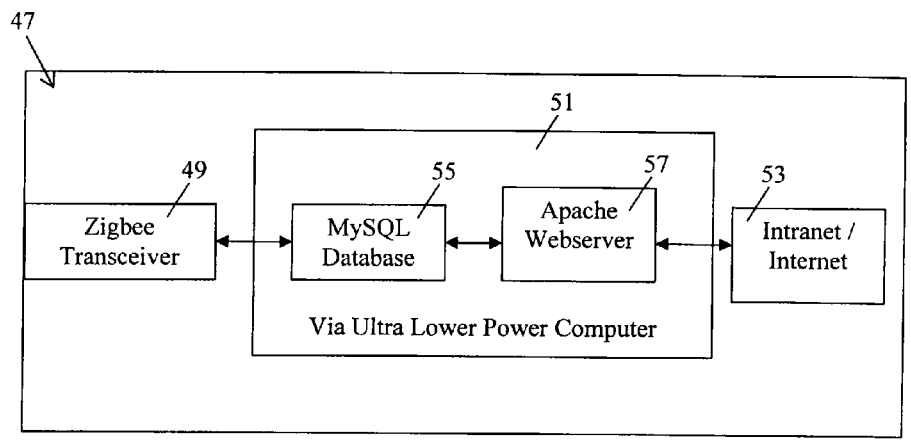
FIG. 6 is a block diagram of a base station.

FIG. 6 shows the functional block diagram of the base station 47. The base station 47 employs a very low power computer 51 integrated with a wireless mesh transceiver 49 to receive, aggregate, and store energy usage data from the nodes. The data is stored into a database 55 where it can be arranged and organized to produce real-time and historical energy usage maps via a web-server 57 also running on the base station. Each appliance can also be individually controlled using a browser on a PC or internet-enabled smartphone, thus allowing users remote viewing and control of energy usage from any location at any time via the interne 53. Management and control can be manual, pre-programmed, or through advanced adaptive algorithms including neural networks, artificial intelligence, and genetic algorithms that can learn usage patterns and adapt to changes. The base station, which must be on at all times to receive the energy usage data from the nodes, should consume as little power as possible. A custom designed computer with only the features required for the EVMS that integrates a low power processor, wireless mesh transceiver, and network interface can also be used. In addition, the base station functionality could be integrated with an internet-connected modem (such as a cable, satellite or DSL modem). This would allow internet service providers to offer additional services like energy management, health monitoring, home automation, and security.

An operating system such as Linux, for example Debian, may be used for its easy-to-use yet powerful package management system that allows software to be quickly installed and effortlessly updated. A database such as MySQL, the leading open source structured query language (SQL) database 55, may be used as the database while a server such as Apache (which runs the majority of the websites on the internet) may be used as the web-server 57. Scripts, such as Perl scripts, bridge these components. Perl is an easy to use, efficient, and complete scripting language that has many libraries that enable the storage of energy usage data from the nodes into the database, perform database queries, generate graphs that can be viewed via the web-server, and perform the back-end work to control the nodes via a webpage.

Figure 7:
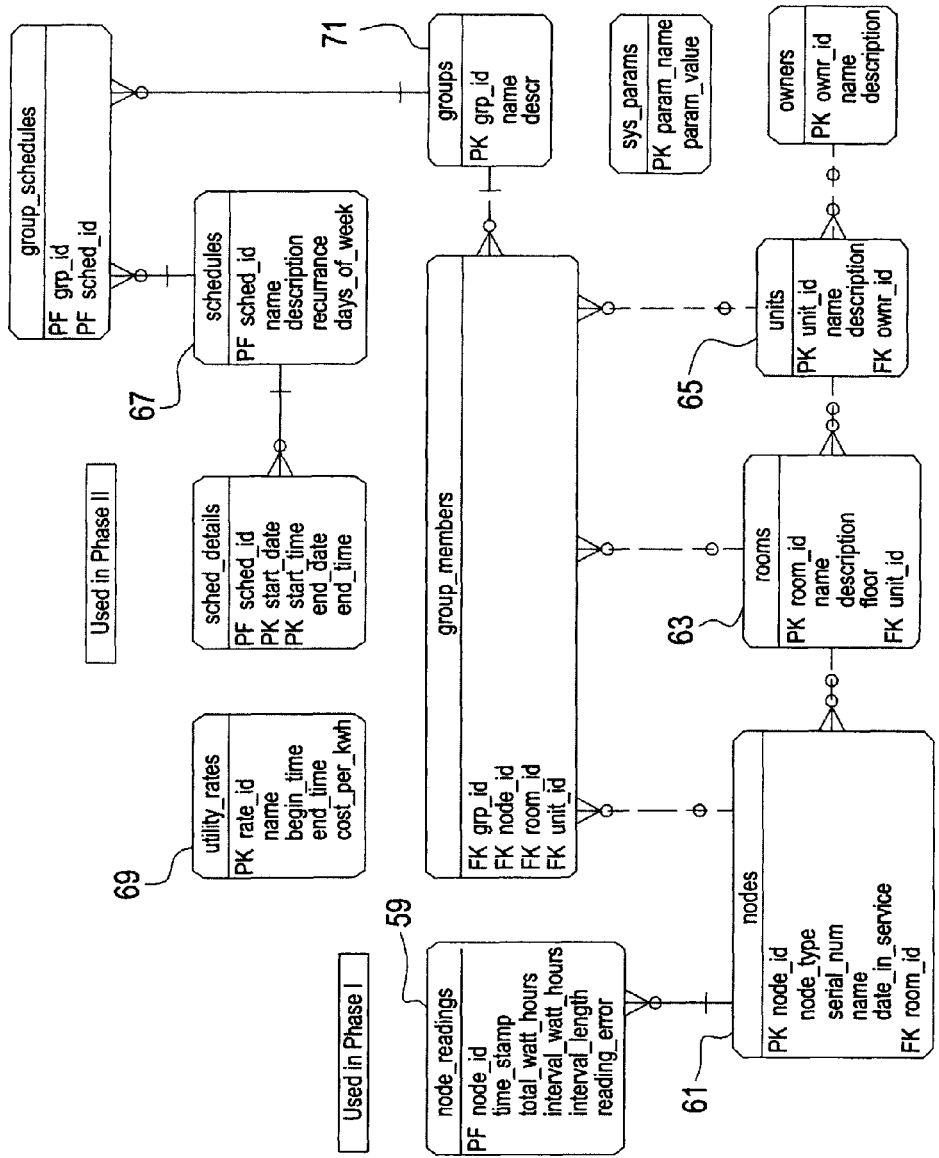
FIG. 7 is a database design.

The relational database is the memory center of the base station. All energy measurements from all of the nodes are constantly being stored into the database via a program that is constantly polling the wireless mesh transceiver. A database design is shown in FIG. 7. The database is composed of a several tables and fields for energy readings of each node 59, node identification 61, and node location 63. Additional fields help with the organization of nodes into rooms and units 65 (or floors). Software algorithms use additional database fields to intelligently control and report irregular energy usage by comparing current consumption with historical usage. Programmable schedules 67 are also possible for each node and utility rate information 69 for real-time cost analysis for each node, each group 71, or the entire system.

Figure 8:
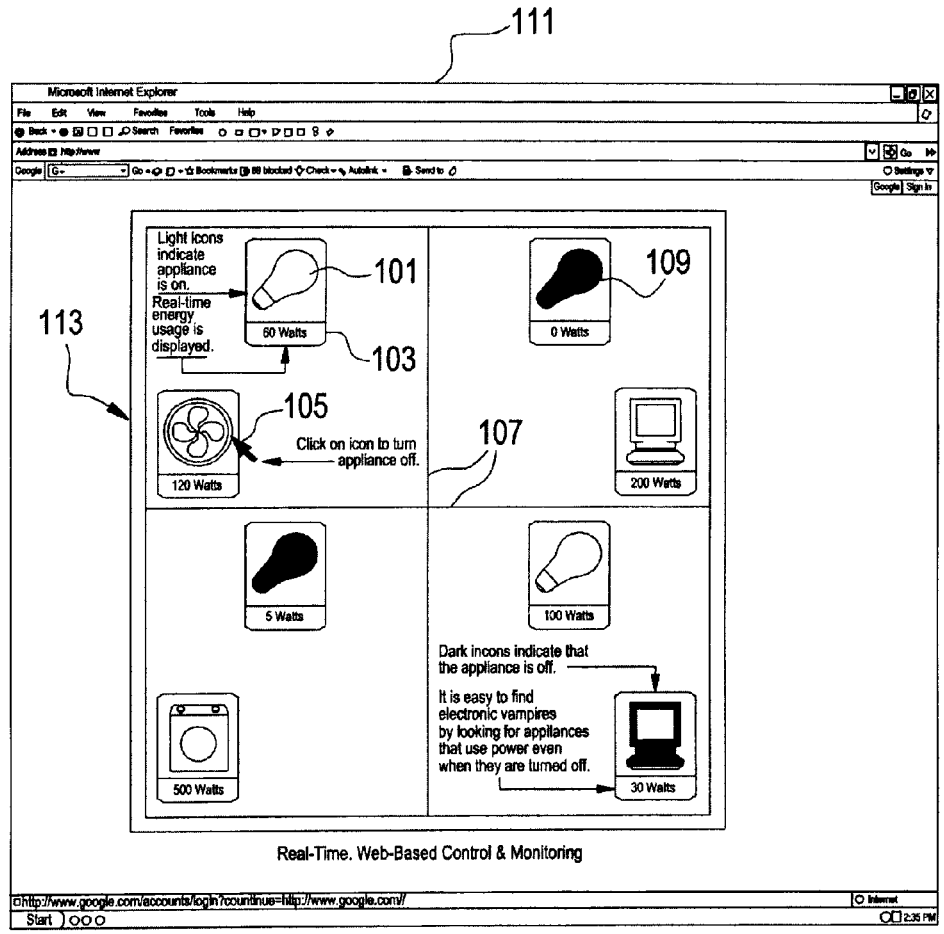
FIG. 8 illustrates an example PC web interface.
Figure 9:
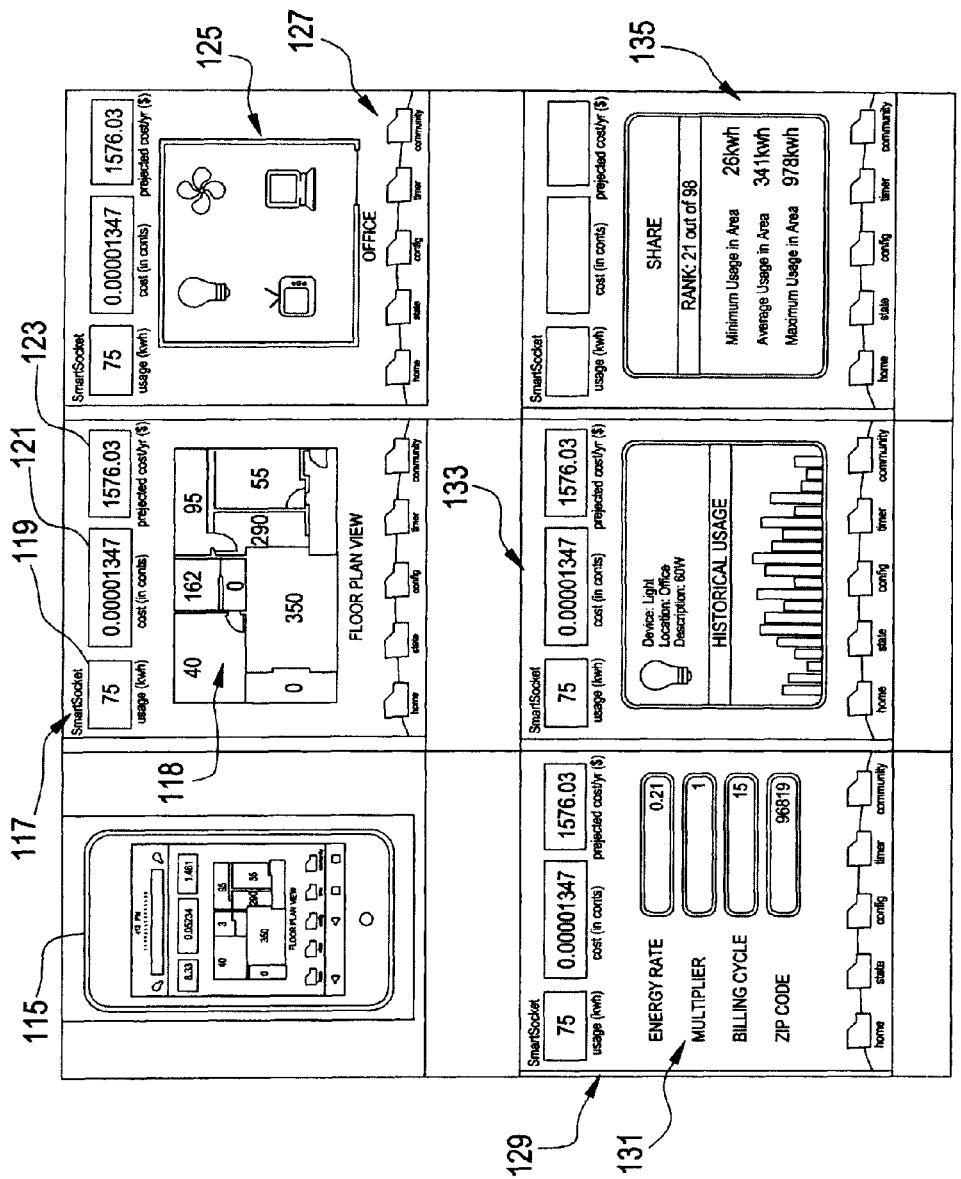
FIG. 9 illustrates an example mobile device interface.

The web-server provides the interface between the EVMS and the rest of the world. Scripts (e.g., CGI) get information out of the database and display it in an easy-to-understand graphical form on a PC web page as shown in FIG. 8 or internet-enabled smart phone web page as shown in FIG. 9. On the PC web page, appliances are represented on the web page 111 by light icons 101 or dark icons 109, depending on whether they are turned on or off. Each icon has an associated display 103 showing the current energy use of the appliance. The appliances may be organized by location on the website, with lines 107 separating appliances in different groups. Control of each node is possible using the same webpage. By clicking on icons representing the appliances with a cursor 105, they can be turned on or off.

FIG. 9 illustrates a smart phone with an energy saving mobile software interface 115. A floor plan view 117 in the interface shows energy usage by room 118, in addition to the universal display of measured usage 119, cost 121, and projected costs 123 of energy. A room view 127 allows control of individual devices 125 by room, in addition to the universal top display. Cost per kWh can be configured by location. Configuration page 129 allows a user to input variables 131 useful in the software's calculations, such as energy rate, multiplier, billing cycle, and zip code. Historical usage and tracking page 133 can show the historical energy usage of different devices. Community/social networking page 135 allows a user to share data in a social media setting to compare and compete with other users in a social network such as Facebook and MySpace.

The present invention is less costly to install and operate in existing buildings than current state-of-the-art energy measurement and management systems. The present invention can monitor and control every single outlet, unlike existing hard-wired and wireless systems that have very high installation costs. The present invention, using COTS wireless mesh networking technology, is extremely inexpensive, easy-to-install, saves energy, and alleviates global climate change.

Every home or business that uses electricity would benefit from this invention. The invention gives consumers of electricity the ability to visualize, audit, and reduce energy usage. State owned utilities will want this invention to reduce energy demand to avoid building additional power plants. The invention offers a low-cost, easy-to-install, and easy-to-use system to visualize and control energy usage, unlike existing systems that are expensive and complicated and must be professionally installed and maintained.

Example:

In one implementation, the smart wall socket uses a Zigbee transceiver integrated with a microcontroller to reduce cost. Freescale's MC 13213may be used, which uses just 19.5milliwatts of power. The MC13213incorporates a low power 2.4GHz radio frequency transceiver and an 8-bit microcontroller into a single 9x9x1mm 71-pin LGA package.

The combination of the radio and a microcontroller in a small package allows for a cost-effective solution. The MC13213contains an RF transceiver which is an 802.15.4Standard compliant radio that operates in the 2.4GHz industrial, scientific, and medical (ISM) frequency band. The transceiver includes a low noise amplifier, 1mW nominal output power, power amplifier with internal voltage controlled oscillator (VCO), integrated transmit/receive switch, on-board power supply regulation, and full spread-spectrum encoding and decoding. The MC13213also contains a microcontroller based on the HCS08Family of microcontrollers and can provide up to 60KB of flash memory and 4KB of RAM. The onboard MCU allows the communications stack and also the application to reside on the same chip.

At the heart of each smart wall socket is an IC from Cirrus Logic with all the functions needed to measure the true power usage. The CS5460A is an energy metering IC which is a highly integrated power measurement solution which combines two Sigma-Delta Analog-to-Digital Converters (ADCs), high speed power calculation functions, and a serial interface on a single chip. It is designed to accurately measure and calculate: Real (True) Energy, Instantaneous Power, Irms, and Vrms for single phase 2- or 3-wire power metering applications. The CS5460A interfaces to a low-cost shunt resistor or transformer to measure current, and to a resistive divider or potential transformer to measure voltage. The CS5460A features a bi-directional serial interface for communication with the MC13213 and uses only 11.6 milliwatts of power.

In a direct current (DC) circuit, the Power used by a load is equal to the product of the Voltage at the load and the Current flowing through it. This is expressed as: Watts=Volts * Amps. In alternating current (AC) circuits, the relative timing between the alternating Voltage and Current is important. Measuring Voltage and Current will result in artificially high results if there is a delay between the voltage and current waveforms. These delays can occur when the load is a motor or an electronic circuit. The CS5460A solves this problem by measuring the instantaneous values of voltage and current many times a second, multiplying them together, and averaging those products. Since at any instant, the formula Watts=Volts * Amps holds, this approach measures the actual Power being used. Once power is accurately measured, Energy is simply the result of Power and Time, and is typically measured in kilowatt hours (kWh).

The relay used to turn on and off the appliance may be Crydom's PX240D5 Solid State Relays (SSR). The AC Relays are optically isolated to protect the controlling microcontroller and can switch up to 5 amps at 280 VAC at 47 to 63 Hz. Since Crydom SSRs do not have mechanical contacts, the arcing, pitting, and the short product life associated with electromechanical relays is eliminated. Their epoxy sealed design even allows use in moisture prone locations. Crydom also makes larger relays that can handle up to 125 Amps. These relays are pin compatible with the PX240D5 but have a larger form factor which will require a larger enclosure.

The base station may use an ultra low power PC from Via Technologies that uses less than 10 watts.

Figure 4:
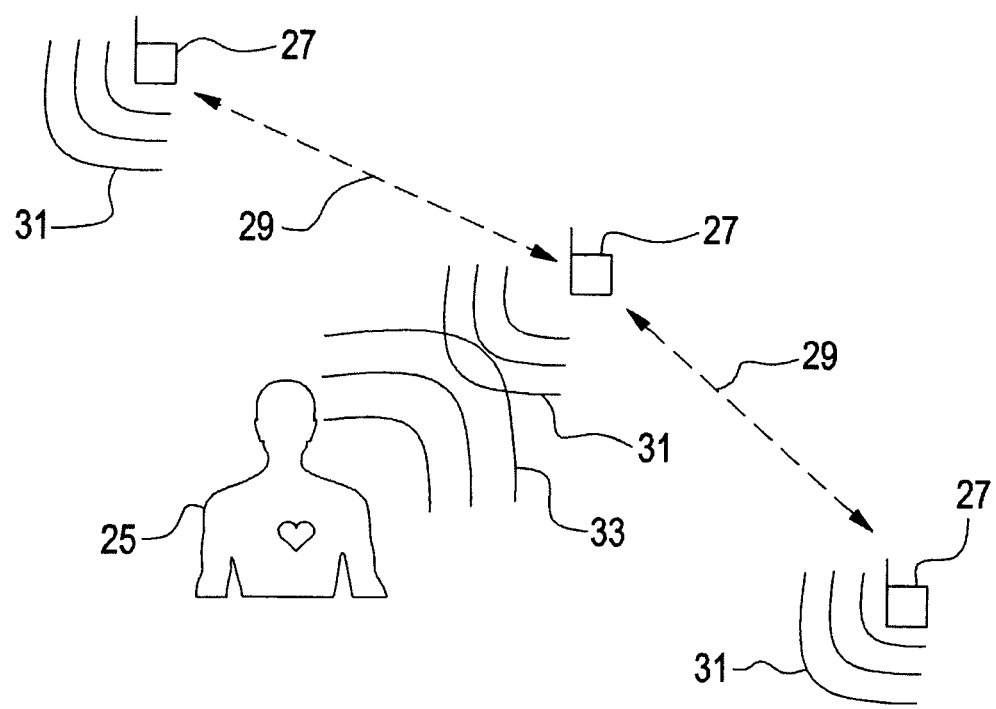
FIG. 4 is a diagram of a pseudo-passive radar system using a wireless mesh network waveform.

FIG. 4 illustrates pseudo-passive radar sensing using wireless mesh network communications. The target 25 can be anything that moves, including a human. The wireless nodes 27 provide the radar signal 31 which are identical to the communications signal 29. The radar return 33 (Doppler return for a coherent radar) can be measured by the wireless node 27 and information on the target (presence, vital signs, movement) can be determined. The sensor information can be transferred to the base station through the wireless network. The position of the network nodes 27 and measured targets 25 can be determined from the radar returns using several known methods including received signal strength (RSS), time difference of arrival (TDOA), direction of arrival (DOA), and pulse-/frequency-modulated ranging. The localization capability of the system allows targets to be tracked spatially and temporally, potentially uniquely identified through their motion and vital-sign signature.

A mesh-networked sensor platform has a mesh network that connects with existing electrical infrastructure for power. Nodes in the network may be powered through other means such as battery or energy scavenging. The mesh network forms a self-healing and self-configuring network that is robust against individual node failures. A plurality of sensors can be connected to the network at the nodes; sensors may include environmental sensors, radar, optical, infrared, acoustic, etc. Individual nodes have the capability to read sensors and control power to any attached device. The wireless mesh network communications signal itself can be used as a radar signal for detection and ranging. Information from the sensors is transmitted back to one or more base stations for analyses and dissemination. The base station is remotely connected so that system management can be performed in real time from a variety of platforms including phones, laptops, PCs and PDAs.

Low-cost wireless mesh networking ICs, energy monitoring ICs and solid state relays are used to create a low-cost, easy-to-install energy visualization and management system. By monitoring each electronic appliance and wirelessly reporting the energy usage back to a central base station, energy usage profiles can be created, the first step in reducing wasted energy. Once an energy usage profile is available, the system can intelligently control energy usage at the sockets to stop energy from being wasted. Software for the base station uses historical energy usage data to create an energy usage profile to automatically detect anomalies in energy usage and take steps to correct them. Once the network is established, other sensors can be easily added for a multitude of applications. By using a central base station and easy-to-install nodes, the system can be expanded to cover every appliance in a large building.

While the invention has been described with reference to specific embodiments, modifications and variations of the invention may be constructed without departing from the scope of the invention, which is defined in the following claims.

We claim:

1. Apparatus comprising a smart socket, further comprising:
   a plug adapted for connecting to a power line receptacle,
   a power supply within the smart socket connected to the plug and adapted for receiving line power from the plug and converting the line power to local power,
   an AC outlet connected to the line power for transmitting line power from the plug to the AC outlet,
   an energy meter within the smart socket connected to the line power and connected to the local power supply,
   a microprocessor connected to the power supply and to the energy meter, and
   a memory and a wireless networking transceiver connected to the microprocessor, and
   a relay connected to the microprocessor to control the flow of line energy from the plug to the outlet.

2. The apparatus of claim 1, further comprising an AC outlet connected to the line power for transmitting line power from the plug to the AC outlet.

3. The apparatus of claim 2, wherein the energy meter is adapted to sense energy flowing from the plug to the AC outlet and to communicate information to the microprocessor related to the sensed information.

4. The apparatus of claim 1, further comprising a memory within the smart socket and connected to the microprocessor.

5. The apparatus of claim 1, further comprising a transceiver within the smart socket and connected to the microprocessor.

6. The apparatus of claim 1, further comprising a relay within the smart socket and connected to the power supply and the microprocessor.

7. Apparatus comprising a smart socket having a plug for connecting to a power receptacle, a power supply in the smart socket and connected to receiving input power from the plug, an outlet in the smart socket and connected to the plug flow line energy from the plug through the outlet, a sensor in the smart socket connected to the power supply and mounted between the plug and the outlet to sense energy passing from the plug to the outlet and a relay connected to a microprocessor to control the flow of line energy from the plug to the AC outlet.

\* \* \* \* \*